(12) United States Patent
Kim

(10) Patent No.: US 10,622,557 B2
(45) Date of Patent: Apr. 14, 2020

(54) CROSS-POINT ARRAY DEVICE AND METHOD OF MANUFACTURING THE SAME

(71) Applicant: SK hynix Inc., Icheon (KR)

(72) Inventor: Seong Hyun Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 2 days.

(21) Appl. No.: 16/013,962

(22) Filed: Jun. 21, 2018

(65) Prior Publication Data
US 2019/0148636 A1 May 16, 2019

(30) Foreign Application Priority Data
Nov. 15, 2017 (KR) .................. 10-2017-0152634

(51) Int. Cl.
*H01L 45/00* (2006.01)
*H01L 27/24* (2006.01)

(52) U.S. Cl.
CPC ........ *H01L 45/085* (2013.01); *H01L 27/2409* (2013.01); *H01L 27/2427* (2013.01); *H01L 27/2463* (2013.01); *H01L 45/08* (2013.01); *H01L 45/1233* (2013.01); *H01L 45/1266* (2013.01); *H01L 45/146* (2013.01); *H01L 45/1616* (2013.01); *H01L 45/1666* (2013.01); *H01L 45/1675* (2013.01); *H01L 45/06* (2013.01); *H01L 45/126* (2013.01); *H01L 45/142* (2013.01); *H01L 45/143* (2013.01); *H01L 45/144* (2013.01); *H01L 45/147* (2013.01)

(58) Field of Classification Search
CPC ............. H01L 27/2409; H01L 27/2427; H01L 27/2463; H01L 45/06; H01L 48/085; H01L 45/1233; H01L 45/1266; H01L 45/141; H01L 45/142; H01L 45/143; H01L 45/144; H01L 45/145; H01L 45/146; H01L 45/147; H01L 45/1616; H01L 45/1666; H01L 45/1675
See application file for complete search history.

(56) References Cited

U.S. PATENT DOCUMENTS

| | | | |
|---|---|---|---|
| 9,450,021 B1 * | 9/2016 | Lee | H01L 27/2463 |
| 9,558,949 B2 | 1/2017 | Konevecki et al. | |
| 9,577,009 B1 * | 2/2017 | Shih | H01L 45/1233 |
| 2011/0001108 A1 * | 1/2011 | Greene | H01L 27/2436 257/2 |
| 2014/0203236 A1 * | 7/2014 | Chen | H01L 45/16 257/4 |
| 2014/0252295 A1 * | 9/2014 | Liao | H01L 45/04 257/2 |
| 2015/0243708 A1 | 8/2015 | Ravasio et al. | |
| 2015/0262864 A1 * | 9/2015 | Okamoto | H01L 21/31116 438/671 |
| 2017/0256310 A1 * | 9/2017 | Arayashiki | G11C 13/0011 |

* cited by examiner

*Primary Examiner* — Stephen W Smoot

(57) ABSTRACT

A cross-point array device according to an embodiment includes a substrate, a first pillar structure, including a threshold switching layer, disposed on the substrate, a resistance switching layer surrounding an upper surface and a sidewall surface of the first pillar structure, and a second pillar structure, including a resistance change memory layer, disposed on the resistance switching layer. The resistance switching layer has a conductive filament electrically connecting the first pillar structure to the second pillar structure.

20 Claims, 12 Drawing Sheets

CROSS-POINT ARRAY DEVICE AND METHOD OF MANUFACTURING THE SAME

CROSS-REFERENCE TO RELATED APPLICATION

The present application claims priority under 35 U.S.C 119(a) to Korean Patent Application No. 10-2017-0152634, filed on Nov. 15, 2017, which is herein incorporated by reference in its entirety.

BACKGROUND

1. Technical Field

Various embodiments of the present disclosure generally relate to a semiconductor device, and more particularly, relate to a cross-point array device and a method of manufacturing the same.

2. Related Art

The cross-point array device may have a structure including a pair of conductive lines crossing on different planes and a unit cell in the form of a pillar structure disposed in an area where the pair of conductive lines intersect. Recently, a structure including a nonvolatile memory element requiring a highly integrated memory cell region has been proposed in the cross-point array device. Specifically, the nonvolatile memory element may include a resistive random access memory (ReRAM) element, a phase change random access memory (PcRAM) element, a magnetic random access memory (MRAM) element and the like.

Meanwhile, in the cross-point memory array structure in which the nonvolatile memory element is employed as a unit cell, there may be writing errors or reading errors on cell information due to an undesired sneak current that may be generated between adjacent cells. In order to prevent the writing errors or the reading errors from occurring due to the undesired sneak current, a structure in which a selection element is additionally disposed in the pillar structure of memory devices has been proposed.

SUMMARY

There is disclosed a cross-point array device according to one aspect of the present disclosure. The cross-point array device includes a substrate, a first pillar structure, including a threshold switching layer, disposed on the substrate, a resistance switching layer surrounding an upper surface and a sidewall surface of the first pillar structure, and a second pillar structure, including a resistance change memory layer, disposed on the resistance switching layer. The resistance switching layer has a conductive filament electrically connecting the first pillar structure to the second pillar structure.

There is disclosed a method of manufacturing a cross-point array device according to one aspect of the present disclosure. In the method, a substrate is provided. A first pillar structure having a threshold switching layer is formed on the substrate. A resistance switching layer surrounding an upper surface and side surface of the first pillar structure is formed over the substrate. A second pillar structure having a resistance change memory layer, is formed on the resistance switching layer. A conductive filament is formed in the resistance switching layer. The conductive filament electrically connects the first pillar structure to the second pillar structure.

DETAILED DESCRIPTION

Figure 1:
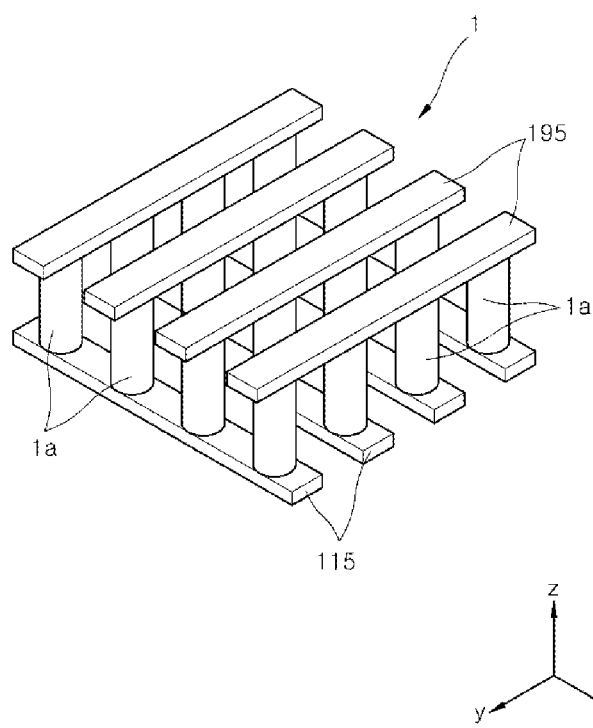
FIG. 1 is a perspective view schematically illustrating a cross-point array device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a perspective view schematically illustrating a cross-point array device 1 according to an embodiment of the present disclosure. In the cross-point array device 1 of FIG. 1, for the convenience of illustration, a substrate and a plurality of insulating layers disposed in the cross-point array device 1 are omitted. In an embodiment, the cross-point array device 1 may include a nonvolatile memory element such as a resistive RAM element, a phase change RAM element, a magnetic RAM and the like.

Referring to FIG. 1, the cross-point array device 1 may include first conductive lines 115 extending in a first direction (for example, x-direction), second conductive lines 195 extending in a second direction (for example, y-direction), and pillar structures 1a disposed at overlap regions where the first conductive lines 115 and the second conductive lines 195 overlap along a third direction (for example, z-direction). Although, in the illustrated embodiment, the first and second directions are illustrated in a rectangular coordinate system in which they are orthogonal to each other, the present disclosure is not limited thereto, and various modifications may be made as long as the condition that the first and second directions are not parallel is satisfied. On the other hand, each of the pillar structures 1a may include a unit cell of the above-described nonvolatile memory elements. The pillar structures 1a may constitute a plurality of arrays distributed along the first direction and the second direction.

Figure 2:
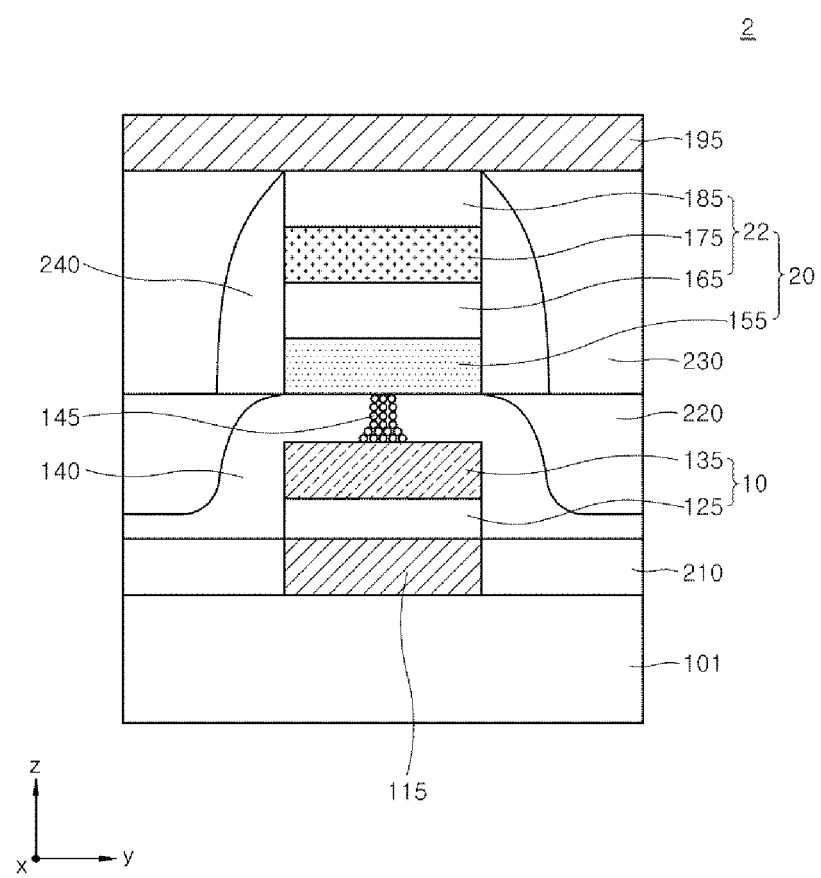
FIG. 2 is a cross-sectional view schematically illustrating a portion of a cross-point array device according to an embodiment of the present disclosure.

FIG. 2 is a cross-sectional view schematically illustrating a portion of a cross-point array device 2 according to an embodiment of the present disclosure.

Referring to FIG. 2, the cross-point array device 2 may include a first conductive line 115 disposed on a substrate 101, a first pillar structure 10 disposed on the first conductive line 115, a resistance switching layer 140 surrounding or covering the first pillar structure 10, a second pillar structure 20 disposed on the resistance switching layer 140, and a second conductive line 195 disposed on the second pillar structure 20. The resistance switching layer 140 may include one or more conductive filaments 145 electrically connecting the first pillar structure 10 to the second pillar structure 20. The structure including the first pillar structure 10, the resistance switching layer 140 and the second pillar structure 20 of the cross-point array device 2 in FIG. 2 may be included in pillar structures 1a of the cross-point array device 1 in FIG. 1.

In the cross-point array device 2 of FIG. 2, the first pillar structure 10 and the second pillar structure 20 are disposed in a region or area where the first conductive line 115 and the second conductive line 195 cross or intersect each other. Although one unit cell, including the first pillar structure 10 and the second pillar structure 20, is shown as an example, embodiments of the present disclosure are not necessarily limited thereto. The cross-point array device 2 may include a plurality of unit cells arranged in regions where a plurality of first conductive lines 115 and a plurality of second conductive lines 195 cross each other, as shown in FIG. 1.

Referring to FIG. 2, a substrate 101 may be provided. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate. The substrate 101 may be doped with an n-type dopant or a p-type dopant. The substrate 101 may have a well at least a portion thereof doped with an n-type or a p-type dopant, as non-limiting examples.

The first conductive line 115 extending in a first direction may be arranged or disposed on the substrate 101. In an embodiment, the first direction may be a direction parallel to an x-axis. The first conductive line 115 may include metal, conductive metal nitride, or conductive metal oxide, as non-limiting examples. The first conductive line 115 may be electrically insulated from another first conductive line 115 which is adjacent or parallel in the lateral or second direction by a lower insulating layer 210. The lower insulating layer 210 may include oxide, nitride, or oxynitride, as non-limiting examples.

The first pillar structure 10 may be arranged or disposed on the first conductive line 115. The first pillar structure 10 may include a lower electrode layer 125 and a threshold switching layer 135. As will be described later, the threshold switching layer 135 may function as a switching layer of a selection element in the cross-point array device 2.

The lower electrode layer 125 may be electrically connected to the first conductive line 115. The lower electrode layer 125 may include a conductive material. The lower electrode layer 125 may include, for example, metal, conductive metal nitride, or conductive metal oxide. The lower electrode layer 125 may include, for example, gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$) and the like.

The threshold switching layer 135 may maintain a relatively high resistance state when a voltage less than a predetermined threshold voltage is applied to both ends of the threshold switching layer 135, or when no voltage is applied. When a voltage equal to or higher than the predetermined threshold voltage is applied to both ends of the threshold switching layer 135, the threshold switching layer 135 can be switched from the high or relatively high resistance state to a low or relatively low resistance state. The threshold switching layer 135 can maintain the low resistance state only while a voltage equal to or higher than the predetermined threshold voltage is applied to both ends of the threshold switching layer 135. That is, when the applied voltage is removed, or the applied voltage is reduced to be less than the predetermined threshold voltage, the threshold switching layer 135 can return to a high or relatively high resistance state. As such, the threshold switching layer 135 may perform a volatile switching operation.

The threshold switching layer 135 may include metal oxide, metal nitride, or a chalcogenide-based material. The metal oxide may include, for example, silicon oxide, aluminum oxide, zirconium oxide, hafnium oxide, tungsten oxide, titanium oxide, nickel oxide, copper oxide, manganese oxide, tantalum oxide, niobium oxide or iron oxide, as non-limiting examples. In an embodiment, the metal oxide may include a dopant. The dopant may include boron (B), nitrogen (N), carbon (C), phosphorus (P), aluminum (Al), lanthanum (La), niobium (Nb), vanadium (V), tantalum (Ta), tungsten (W), chromium (Cr), molybdenum (Mo) or a combination of two or more thereof, as non-limiting examples. The metal nitride may include, for example, silicon nitride.

The chalcogenide-based material may include, for example, germanium-antimony-tellurium (Ge—Sb—Te). The germanium-antimony-tellurium (Ge—Sb—Te) may include, for example, $Ge_2Sb_2Te_5$, $GeSb_2Te_4$, $GeSb_4Te$ and the like. The chalcogenide-based material may include, for example, germanium-tellurium (Ge—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt) and the like.

Referring to FIG. 2, the resistance switching layer 140 may be disposed on the lower insulating layer 210 to surround or envelop an upper surface and side surfaces of the first pillar structure 10. The resistance switching layer 140 may include conductive filaments 145. The conductive filaments 145 may electrically connect the threshold switching layer 135 of the first pillar structure 10 to a metal supply layer 155 of the second pillar structure 20. The resistance switching layer 140 can ensure or facilitate electrical conductivity through the conductive filaments 145. That is, the resistance switching layer 140 can provide conductive filaments 145 that serve as upper electrodes for the threshold switching layer 135, or that serve as conduction paths for electric charges between the threshold switching layer 135 and the metal supply layer 155. Although, in the illustrated embodiment of FIG. 2, one group of conductive filaments 145 are illustrated between the threshold switching layer 135 and the metal supply layer 155, the present disclosure is not limited thereto, and at least two groups of conductive filaments 145 may be formed in different positions between the threshold switching layer 135 and the metal supply layer 155.

In an embodiment, the conductive filaments 145 may include metal, such as copper (Cu) or silver (Ag). As will be described later with reference to FIG. 12, when a voltage equal to or higher than a predetermined threshold voltage is applied between the metal supply layer 155 and the lower electrode layer 125, metal ions that are supplied from the metal supply layer 155 and migrate into the resistance switching layer 140 may be reduced by electrons to form the conductive filaments 145. The electrons may be supplied from the threshold switching layer 135 when the threshold switching layer 135 is in a low or relatively low resistance state. Accordingly, the conductive filaments 145 may be formed to connect the upper surface of the threshold switching layer 135 to the bottom surface of the metal supply layer 155. The remaining region of the resistance switching layer 140 except the conductive filaments 145 may be maintained in the electrically high resistance state as charge conduction takes place only or primarily through the conductive filaments 145. Thus, the charge conduction may be controlled or influenced by the cross-sectional area of the conductive filaments 145, for example, the area on the x-y plane that is perpendicular to the z-direction. In an embodiment, the conductive filaments 145 can reduce an operating current of the cross-point array device 1 by reducing the cross-sectional area through which charges are conducted between the first pillar structure 10 and the second pillar structure 20, thereby reducing power consumption.

In an embodiment, the resistance switching layer 140 may include metal oxide. The metal oxide may include aluminum oxide, tantalum oxide, titanium oxide, hafnium oxide or a combination of two or more thereof, as non-limiting examples. In another embodiment, the resistance switching layer 140 may include silicon oxide.

The resistance switching layer 140 can serve to protect the threshold switching layer 135 from subsequent processes. That is, the resistance switching layer 140 can prevent the threshold switching layer 135 from being subjected to physical and chemical damage when processes to form the second pillar structure 20 are performed. Accordingly, the operational reliability of the threshold switching layer 135 during the operation of the selection element can be improved.

Meanwhile, a first interlayer insulating layer 220 may be disposed on the resistance switching layer 140. The first interlayer insulating layer 220 may be disposed to fill a space between the first pillar structures 10 in lateral directions (e.g., in x and y directions). An upper surface of the first interlayer insulating layer 220 may be disposed on the same or substantially same plane as an upper surface of the resistance switching layer 140. The first interlayer insulating layer 220 may include oxide, nitride, or oxynitride, as non-limiting examples.

Referring again to FIG. 2, the second pillar structure 20 may be disposed on the resistance switching layer 140. The second pillar structure 20 may include the metal supply layer 155, an intermediate electrode layer 165, a resistance change memory layer 175 and an upper electrode layer 185.

The metal supply layer 155 may include copper (Cu) or silver (Ag). In an embodiment, the metal supply layer 155 may be a copper layer pattern or a silver layer pattern. The metal supply layer 155 may supply metal in the form of ions that move or migrate into the resistance switching layer 140 when a predetermined operating voltage is applied between the first conductive line 115 and the second conductive line 195. The metal ions may be reduced in the resistance switching layer 140 by electrons supplied from the threshold switching layer 135 to form the conductive filaments 145.

The intermediate electrode layer 165, the resistance change memory layer 175 and the upper electrode layer 185 may be sequentially disposed on the metal supply layer 155. The intermediate electrode layer 165, the resistance change memory layer 175 and the upper electrode layer 185 may constitute a nonvolatile memory element 22 of the cross-point array device 2. The nonvolatile memory element 22 may be a resistive RAM element or a phase change RAM element.

The intermediate electrode layer 165 may include a conductive material. The intermediate electrode layer 165 may include metal, conductive metal nitride or conductive metal oxide, as non-limiting examples. The intermediate electrode layer 165 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide (RuO$_2$) and the like, as non-limiting examples.

In an embodiment, when the nonvolatile memory element 22 is a resistive RAM element, the resistance change memory layer 175 may include, for example, metal oxide. The metal oxide may include metal oxide such as titanium oxide, aluminum oxide, nickel oxide, copper oxide, zirconium oxide, manganese oxide, hafnium oxide, tungsten oxide, tantalum oxide, niobium oxide and iron oxide, as non-limiting examples.

In an embodiment, a metal oxide of resistance change memory layer 175 may include oxygen vacancies. That is, when compared to an amount of metal and oxygen that satisfy the stoichiometric ratio, the amount of metal in the metal oxide of this embodiment can be relatively greater than the amount of oxygen in the metal oxide. The oxygen vacancies can have mobility in the metal oxide when a voltage is applied between the intermediate electrode layer 165 and the upper electrode layer 185. When a voltage equal to or higher than a predetermined threshold voltage is applied, the oxygen vacancies may align or group to connect the intermediate electrode layer 165 to the upper electrode layer 185 within the resistance change memory layer 175, so that the resistance of the resistance change memory layer 175 may be changed or converted from a higher resistance state to a lower resistance state. Even after the applied voltage is removed, the arranged oxygen vacancies can remain in the resistance change memory layer 175 such that the nonvolatile memory element 22 has properties or characteristics of a nonvolatile memory.

In another embodiment, when the nonvolatile memory element 22 is a resistive RAM element, the resistance change memory layer 175 may include, as non-limiting examples, a perovskite-based material such as $Pr_{0.7}Ca_{0.3}MnO_3$ (PCMO), $La_{1-x}Ca_xMnO_3$ (LCMO), $Ba_{0.5}Sr_{0.5}Co_{0.8}Fe_{0.2}O_{3-\delta}$ (BSCFO), $YBa_2Cu_3O_{7-x}$ (YBCO), (Ba, Sr)TiO$_3$(Cr, Nb-doped), SrZrO$_3$(Cr, V-doped), (La, Sr)MnO$_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, or $YBa_2Cu_3O_7$. The resistance change memory layer 175 may include, as another example, a selenide-based material such as $Ge_xSe_{1-x}$(Ag, Cu, Te-doped) or metal sulfide such as $Ag_2S$, $Cu_2S$, CdS, or ZnS.

The resistance of the resistance change memory layer 175 can be variably changed by applying a voltage to change an interface barrier height and/or an interface barrier width between the resistance change memory layer 175 and the intermediate electrode layer 165, or between the resistance change memory layer 175 and the upper electrode layer 185. Alternatively, the resistance of the resistance-change memory layer 175 can be variably changed by forming or disconnecting the conductive filaments connecting the intermediate electrode layer 165 and the upper electrode layer 185 in the resistance change memory layer 175 in response to an applied voltage.

In yet another embodiment, when the nonvolatile memory element 22 is a phase change RAM element, the resistance change memory layer 175 may include, for example, a chalcogenide-based material. As an example, the chalcogenide-based material may include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te) and the like, as non-limiting examples. The resistance change memory layer 175 may include, as another example, a chalcogenide-based material including Group 5A element—Sb—Te, Group 6A element—Sb—Te, Group 5A element—Sb—e, or Group 6A element—Sb—Se, as non-limiting examples.

In the nonvolatile memory element 22, the phase change of the resistance change memory layer 175 can be generated by using joule heating provided through the intermediate electrode layer 165 and the upper electrode layer 185. The nonvolatile memory operation of the nonvolatile memory element 22 can be implemented by reversibly changing the resistance of the resistance change memory layer 175 in accordance with the phase change by the joule heating. In an embodiment, crystal structure of the resistance change memory layer 175 may be reversibly changed between a crystalline structure and amorphous structure by the joule heating. When the resistance change memory layer 175 has the crystalline structure, the resistance change memory layer 175 may have a relatively low resistive state, and when the resistance change memory layer 175 has the amorphous structure, the resistance change memory layer 175 may have a relatively high resistive state.

The upper electrode layer 185 may include a conductive material. The upper electrode layer 185 may include metal, conductive metal nitride or conductive metal oxide. The upper electrode layer 185 may include, for example, gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide (RuO$_2$) and the like, as non-limiting examples.

Referring again to FIG. 2, insulating spacers 240 may be disposed on sidewalls of the second pillar structure 20. The insulating spacers 240 can serve to protect the sidewalls or exterior of the second pillar structure 20 and to improve the structural stability of the second pillar structure 20. In addition, the insulating spacers 240 can serve to electrically insulate the conductive second pillar structures in lateral directions. The insulating spacer 240 may include oxide, nitride or oxynitride, as non-limiting examples.

The second pillar structure 20 may be electrically insulated from a neighboring second pillar structure 20 by a second interlayer insulating layer 230. An upper surface of the second interlayer insulating layer 230 may be disposed to be flush or substantially flush with the upper surface of the second pillar structure 20. The second interlayer insulating layer 230 may include oxide, nitride, or oxynitride, as non-limiting examples. In some embodiments, the insulating spacer 240 may be omitted.

A second conductive line 195 extending in a second direction may be disposed on the second pillar structure 20. The second direction may be in any direction that is not parallel to the first direction. In an embodiment, the second direction may be a direction parallel to the y-axis. In an embodiment, the second conductive line 195 may intersect substantially perpendicularly, or with respect to a different plane, with the first conductive line 115. The second conductive line 195 may include metal, conductive metal nitride, or conductive metal oxide, as non-limiting examples.

According to an embodiment of the present disclosure, the first pillar structure including the threshold switching layer of a selection element and the second pillar structure including the resistance change memory layer of a resistive memory element may be disposed separately from each other with the resistance switching layer interposed therebetween. The resistance switching layer may have conductive filaments connecting the first pillar structure to the second pillar structure. The conductive filaments can effectively reduce the operating current of the cross-point array device by reducing the cross-sectional area inside the resistance switching layer where charges are conducted between the first and second pillar structures. As a result, power consumption of the cross-point array device may be effectively reduced. In an embodiment, because the resistance switching layer 140 surrounds or covers the first pillar structure 10, the threshold switching layer 135 of the first pillar structure 10 may be protected from physical and chemical damage that can be generated when the second pillar structure 20 are formed over the first pillar structure 10. Accordingly, structural and electrical reliability of the threshold switching layer 135 can be improved.

Figure 3:
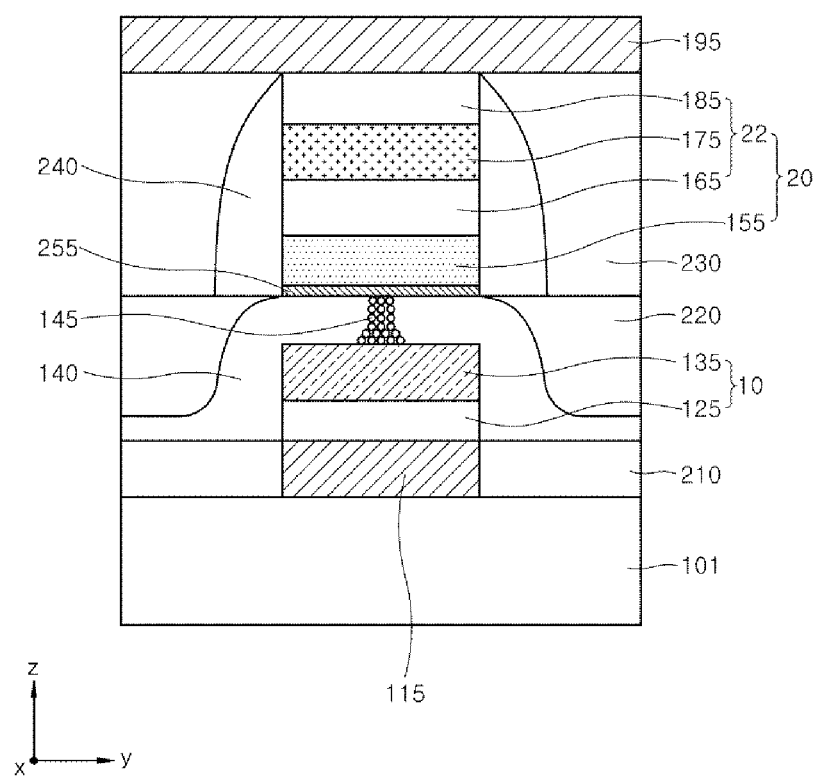
FIG. 3 is a cross-sectional view schematically illustrating a portion of a cross-point array device according to another embodiment of the present disclosure.

FIG. 3 is a cross-sectional view schematically illustrating a portion of a cross-point array device 3 according to another embodiment of the present disclosure. Referring to FIG. 3, the cross-point array device 3 may further include a diffusion barrier layer 255 disposed between a resistance switching layer 140 and a metal supply layer 155, as compared with the cross-point array device 2 described above and with reference to FIG. 2.

The diffusion barrier layer 255 can be formed to control or limit the amount of metal ions supplied from the metal supply layer 155 to the resistance switching layer 140 when an external voltage is applied to the cross-point array device 3. Thus, the diffusion barrier layer 255 can control or limit the formation speed of the conductive filaments 145 and the cross-sectional area of the formed conductive filaments 145 based on the physical and chemical properties such as composition and thickness of the diffusion barrier layer. The diffusion barrier layer 255 may include tantalum (Ta), titanium (Ti), tantalum nitride, titanium nitride, silicon carbide, titanium tungsten, or a combination of two or more thereof, as non-limiting examples.

In the cross-point array device 3, the remaining configuration except for the diffusion barrier layer 255 is substantially the same as the configuration of the cross-point array device 2 described above and with reference to FIG. 2. Therefore, in order to exclude duplication, description for the same configuration will be omitted.

Figure 4:
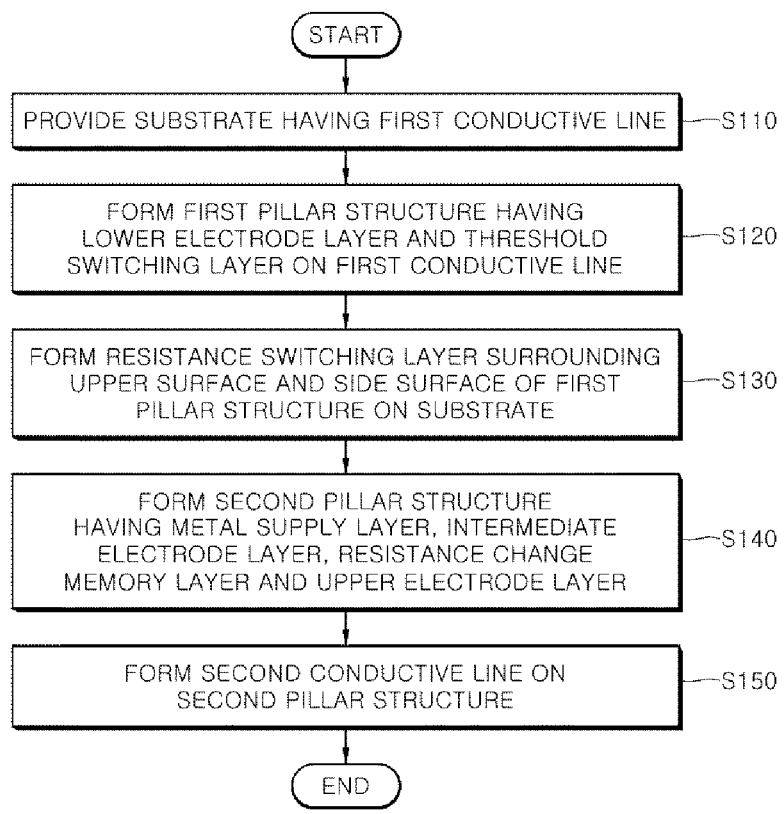
FIG. 4 is a flow chart schematically illustrating a method of manufacturing a cross-point array device according to an embodiment of the present disclosure.
Figure 5:
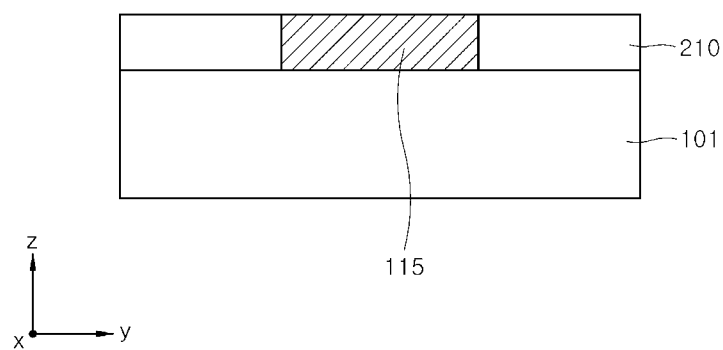
FIGS. 5 to 11 are cross-sectional views schematically illustrating a method of manufacturing a cross-point array device according to an embodiment of the present disclosure.
Figure 6:
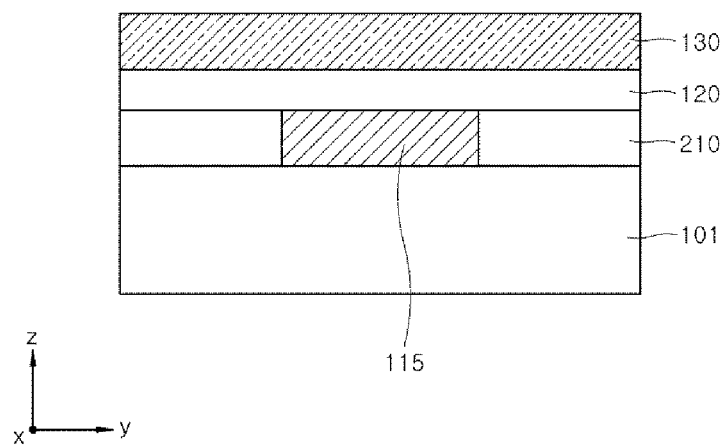

FIG. 4 is a flow chart schematically illustrating a method of manufacturing a cross-point array device according to an embodiment of the present disclosure. FIGS. 5 to 11 are cross-sectional views schematically illustrating the method of manufacturing the cross-point array device according to an embodiment of the present disclosure.

Referring to operation S110 in FIG. 4, a substrate having a first conductive line formed thereon may be provided. More specifically, referring to FIG. 5, a substrate 101 may be provided. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate, as non-limiting examples. The substrate 101 may be doped with an n-type dopant or a p-type dopant. The substrate 101 may have a well at least a portion thereof doped with an n-type dopant or a p-type dopant.

A first conductive line 115 may be formed on the substrate 101. In an embodiment, the first conductive line 115 may be formed as follows. At first, a lower insulating layer 210 having a trench pattern extending in a first direction, that is, an x-direction may be formed on the substrate 101. Next, the trench pattern may be filled with a conductive material and a planarization process may be performed to dispose an upper surface of the conductive line 115 and an upper surface of the lower insulating layer 210 on the same plane.

In another embodiment, the first conductive line 115 may be formed as follows. A conductive layer may be formed on the substrate 101 and patterned to form the first conductive line 115. Next, the lower insulating layer covering the first conductive line 115 may be formed, and then the first conductive line 115 and the lower insulating layer 210 may be planarized. As a result, the first conductive line 115 and the lower insulating layer 210 are formed such that the upper surface of the first conductive line 115 and the upper surface of the lower insulating layer 210 are disposed on the same or substantially the same plane. The conductive layer may be formed, for example, using a sputtering method, a chemical vapor deposition method, an atomic layer deposition method and the like.

Referring to operation S120 in FIG. 4, a first pillar structure having a lower electrode layer and a threshold switching layer may be formed on the first conductive line. Specifically, referring to FIG. 6, a lower electrode film 120 and a variable resistance film 130 may be sequentially formed on the first conductive line 115 and the lower insulating layer 210. Next, referring to FIG. 7, the lower electrode film 120 and the variable resistance film 130 may be patterned to form the first pillar structure 10 having a lower electrode layer 125 and a threshold switching layer 135.

The lower electrode film 120 may include metal, conductive metal nitride, or conductive metal oxide, as non-limiting examples. The lower electrode layer 125 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$) and the like, as non-limiting examples. The lower electrode layer 125 may be formed, for example, using a chemical vapor deposition method, a sputtering method, or an atomic layer deposition method and the like.

The variable resistance film 130 may include metal oxide, metal nitride, or a chalcogenide-based material, as non-limiting examples. The metal oxide may include silicon oxide, aluminum oxide, zirconium oxide, hafnium oxide, tungsten oxide, titanium oxide, nickel oxide, copper oxide, manganese oxide, tantalum oxide, niobium oxide or iron oxide, as non-limiting examples. In an embodiment, the metal oxide may include a dopant. The dopant may include boron (B), nitrogen (N), carbon (C), phosphorus (P), aluminum (Al), lanthanum (La), niobium (Nb), vanadium (V), tantalum (Ta), tungsten (W), chromium (Cr), molybdenum (Mo) or a combination of two or more thereof, as non-limiting examples. The metal nitride may include, for example, silicon nitride.

The chalcogenide-based material may include, for example, germanium-antimony-tellurium (Ge—Sb—Te). The germanium-antimony-tellurium (Ge—Sb—Te) may include, for example, $Ge_2Sb_2Te_5$, $GeSb_2Te_4$, $GeSb_4Te$ and the like. The chalcogenide-based material may include germanium-tellurium (Ge—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt) and the like, as non-limiting examples. The variable resistance film 130 may be formed, for example, using a chemical vapor deposition method, a sputtering method, or an atomic layer deposition method and the like.

Figure 7:
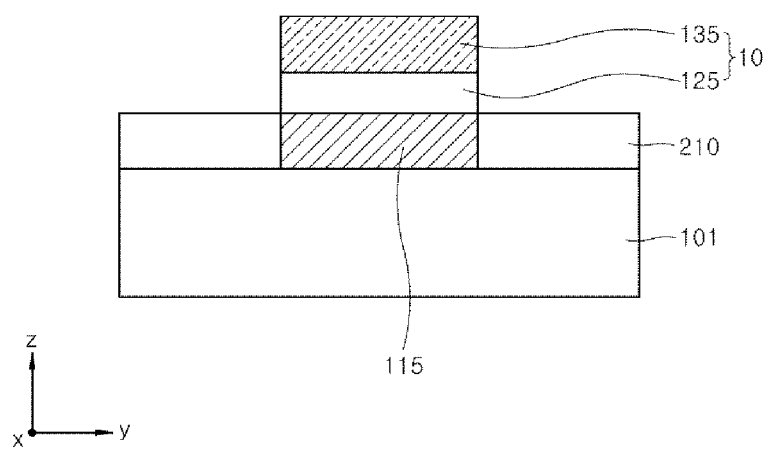
Figure 8:
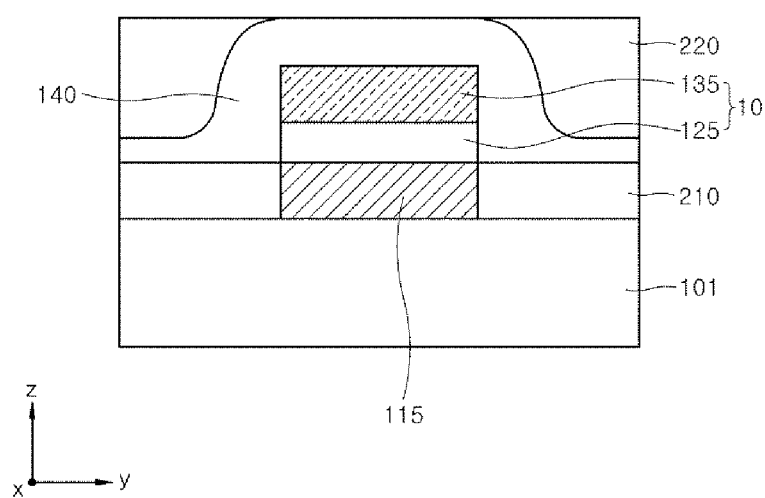
Figure 9:
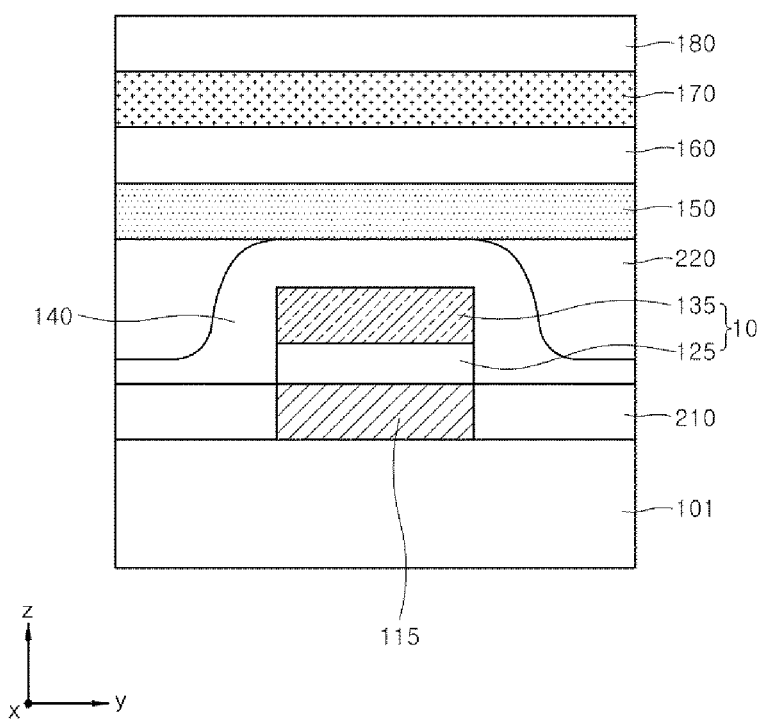

Referring to FIG. 7, the first pillar structure 10 may be formed by sequentially patterning the variable resistance film 130 and the lower electrode film 120 using a pillar forming mask to form the lower electrode layer 125 and the threshold switching layer 135 on the first conductive line 115. At this time, the lower electrode layer 125 may be electrically connected to the first conductive line 115.

Referring to operation S130 in FIG. 4, a resistance switching layer surrounding the upper surface and side surface of the first pillar structure on the substrate may be formed. Specifically, referring to FIG. 8, a resistance switching layer 140 may be formed to surround or cover the upper surface and side surfaces or walls of the first pillar structure 10 on the first conductive line 115 as well as the lower insulating layer 210. In addition, a first interlayer insulating layer 220 may be formed on the resistance switching layer 140.

In an embodiment, the resistance switching layer 140 may include metal oxide. The metal oxide may include aluminum oxide, tantalum oxide, titanium oxide, hafnium oxide, or a combination of two or more thereof, as non-limiting examples. In another embodiment, the resistance switching layer 140 may include silicon oxide. The resistance switching layer 140 may be formed, for example, using an atomic layer deposition method. The resistance switching layer 140 may be deposited in a form of a metal oxide film or a silicon oxide film.

The resistance switching layer 140 may be in a form of metal oxide film. The first interlayer insulating layer 220 may include oxide, nitride, or oxynitride, as non-limiting examples. The first interlayer insulating layer 220 may be formed to fill a space between the first pillar structures 10 in lateral directions. The first interlayer insulating layer 220 may be formed as follows. Firstly, after forming the resistance switching layer 140, an interlayer insulating layer may be formed to fill the space between the first pillar structures 10 and cover resistance switching layer 140. The interlayer insulating layer may be formed, for example, using a coating method, a chemical vapor deposition method, a sputtering method and the like. Next, the upper surfaces of the interlayer insulating layer and the resistance switching layer 140 may be planarized. As a result, the planarized upper surface of the interlayer insulating layer may flush or substantially flush with the upper surface of the resistance switching layer 140. The interlayer insulating layer and the resistance switching layer 140 may be planarized, for example, using a chemical mechanical polishing method.

Referring to operation S140 in FIG. 4, a second pillar structure having a metal supply layer, an intermediate electrode layer, a resistance change memory layer, and an upper electrode layer may be formed on the resistance switching layer. Specifically, referring to FIG. 9, a metal supply film 150, an intermediate electrode film 160, a resistance change memory film 170, and an upper electrode film 180 may be sequentially formed on the resistance switching layer 140 and the first interlayer insulating layer 220. Next, referring to FIG. 10, the metal supply film 150, the intermediate electrode film 160, the resistance change memory film 170, and the upper electrode film 180 may be patterned using the resistance switching layer 140 and the first interlayer insulating layer 220 as etch stop layers. As a result, the second pillar structure 20 may be formed on the resistance switching layer 140. The formed second pillar structure 20 may include the metal supply layer 155, the intermediate electrode layer 165, the resistance change memory layer 175, and the upper electrode layer 185.

The metal supply film 150 may include copper (Cu) or silver (Ag), as non-limiting examples. The metal supply layer film may be formed, for example, using a sputtering method, a chemical vapor deposition method, an atomic layer deposition method. The intermediate electrode film 160 may include metal, conductive metal nitride, or conductive metal oxide, as non-limiting examples. The intermediate electrode film 160 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$) and the like, as non-limiting examples. The intermediate electrode film 160 may be formed, for example, using a sputtering method, a chemical vapor deposition method, an atomic layer deposition method and the like.

In an embodiment, when the resistance change memory film 170 is applied to a resistive memory element, the resistance change memory film 170 may include metal oxide. The metal oxide may include silicon oxide, aluminum oxide, zirconium oxide, hafnium oxide, tungsten oxide, titanium oxide, nickel oxide, copper oxide, manganese oxide, tantalum oxide, niobium oxide or iron oxide, as non-limiting examples. The resistance change memory film 170 may be formed, for example, using a chemical vapor deposition method, an atomic layer deposition method and the like. In an embodiment, the metal oxide may include oxygen vacancies. That is, when compared to an amount of metal and oxygen that satisfy the stoichiometric ratio, the amount of metal in the metal oxide of this embodiment can be relatively greater than the amount of oxygen in the metal oxide.

In another embodiment, when the resistance change memory film 170 is used in a process that forms a resistive RAM element, the resistance change memory film 170 may include, as non-limiting examples, a perovskite-based material such as $Pr_{0.7}Ca_{0.3}MnO_3$ (PCMO), $La_{1-x}Ca_xMnO_3$ (LCMO), $Ba_{0.5}Sr_{0.5}Co_{0.8}Fe_{0.2}O_{3-\delta}$ (BSCFO), $YBa_2Cu_3O_{7-x}$ (YBCO), (Ba, Sr)$TiO_3$(Cr, Nb-doped), $SrZrO_3$(Cr, V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, or $YBa_2Cu_3O_7$ and the like. The resistance change memory film 170 may include, as another example, a selenide-based material such as $Ge_xSe_{1-x}$(Ag, Cu, Te-doped) or metal sulfide such as $Ag_2S$, $Cu_2S$, CdS, or ZnS. The resistance change memory film 170 may be formed, for example, using a sputtering method, a chemical vapor deposition method, an atomic layer deposition method and the like.

In another embodiment, when the resistance change memory film 170 is employed in process forming a phase change RAM element, the resistance change memory film 170 may include, for example, a chalcogenide-based material. As a specific example, the chalcogenide-based material may germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te) and the like. The resistance change memory film 170 may include chalcogenide-based material including a Group 5A element—Sb—Te, a Group 6A element—Sb—Te, a Group 5A element—Sb—Se, or a Group 6A element—Sb—Se, as non-limiting examples. The resistance change memory film 170 may be formed, for example, using a chemical vapor deposition method, an atomic layer deposition method and the like.

The upper electrode film 180 may include a conductive material. The upper electrode film 180 may include, for example, conductive metal nitride or conductive metal oxide. The upper electrode film 180 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$) and the like, as non-limiting examples.

The upper electrode film 180, the resistance change memory film 170, the intermediate electrode film 160 and the metal supply film 150 may be patterned using an etching mask having a pillar pattern by an anisotropic etching method like dry etching. As a result, the second pillar structure 20 may be formed on the resistance switching layer 140. The second pillar structure 20 can be electrically separated from the first pillar structure 10 by the resistance switching layer 140. Electrical connections between the first pillar structure 10 and the second pillar structure 20 may occur through the conductive filaments having controlled cross-sectional area generated in the resistance switching layer 140. As a result, charge conduction between the first pillar structure 10 and the second pillar structure 20 is effectively controlled such that the operating current of the cross-point array device may be effectively controlled. In an embodiment, the threshold switching layer 135 of the first pillar structure 10 can be protected by the resistance switching layer 140 when the process of forming the second pillar structure 20 proceeds. More specifically, because the threshold switching layer 135 may be protected from physical and chemical damage during the formation of the second pillar structure 20 over the first pillar structure 10, structural and electrical reliability of the threshold switching layer 135 can be improved.

Figure 10:
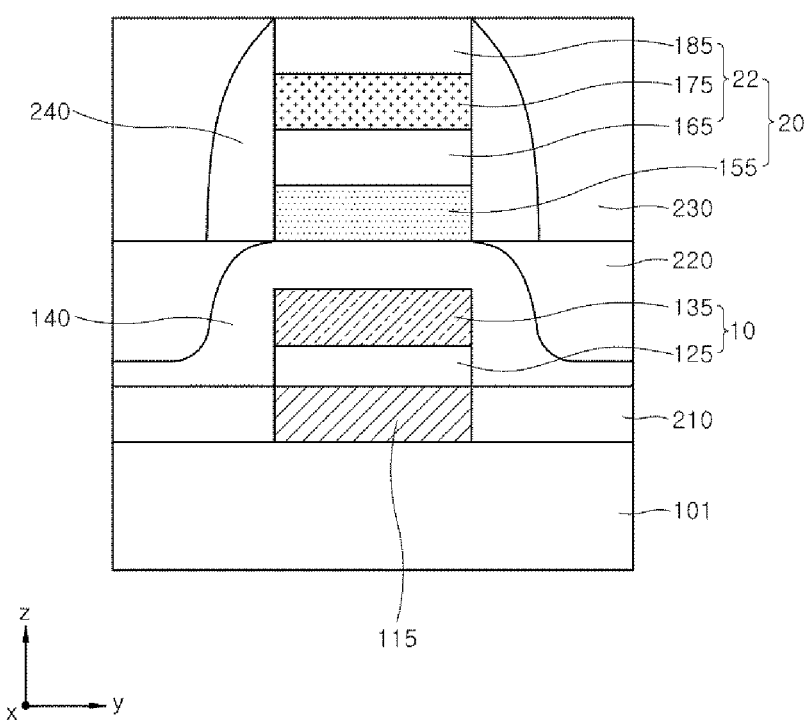
Figure 11:
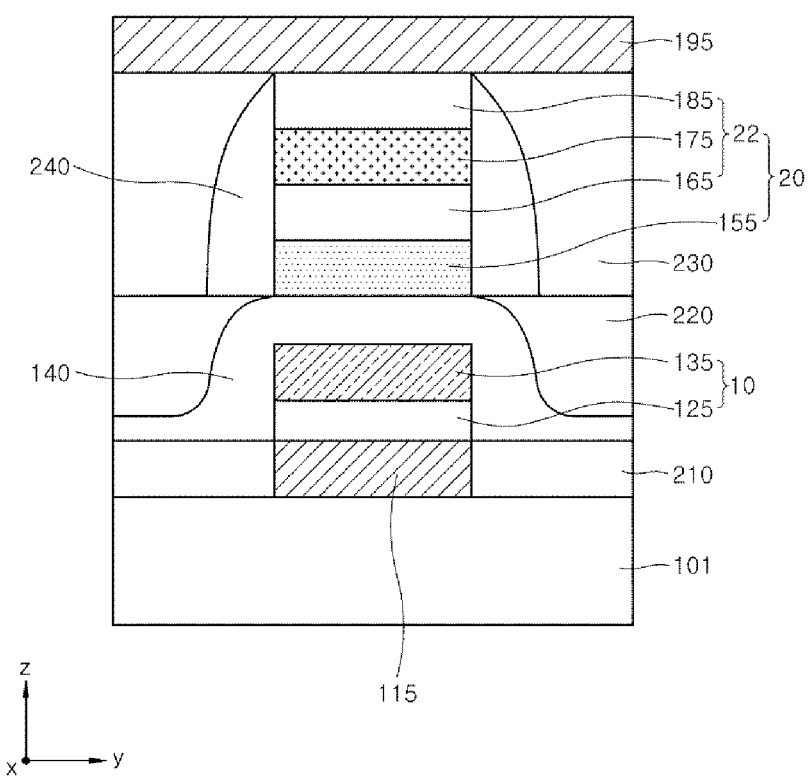

Referring to FIG. 10, insulating spacers 240 may be formed on sidewalls of the second pillar structure 20. The insulating spacers 240 may include oxide, nitride, or oxynitride, as non-limiting examples. In order to form the insulating spacers 240, a film may be formed, for example, using a chemical vapor deposition method, a sputtering method, an atomic layer deposition method and the like, and then the film may be etched using an anisotropic etching method like etch back. A second interlayer insulating layer 230 may be formed in a space between the second pillar structures 20 having the insulating spacers 240 or to cover the insulating spacers 240. The second interlayer insulating layer 230 may include oxide, nitride, or oxynitride, as non-limiting examples. The second interlayer insulating layer 230 may be formed using, for example, a chemical vapor deposition method, a sputtering method, an atomic layer deposition method and the like. After forming the second interlayer insulating layer 230, the second interlayer insulating layer 230 may be planarized. As a result, the upper surface of the second pillar structure 20 and an upper surface of the second interlayer insulating layer 230 can be located on the same or substantially same plane.

Referring to operation S150 in FIG. 4, a second conductive line may be formed on the second pillar structure. The second conductive line may extend in a direction that is not parallel to the first conductive line. Specifically, referring to FIG. 11, a conductive film including at least one of metal, conductive metal nitride, conductive metal oxide may be formed on the second pillar structure 20 and the second interlayer insulating layer 230, and the conductive film then may be patterned to form a second conductive line 195 extending in the second direction, e.g., in an y-direction. The second conductive line 195 may intersect substantially vertically on a different plane with the first conductive line 115.

By proceeding the above-described processes, the cross-point array device according to an embodiment of the present disclosure can be manufactured. According to some other embodiments, in forming the metal supply film 150, the intermediate electrode film 160, the resistance change memory film 170, and the upper electrode film 180 described above with reference to FIG. 9, a diffusion barrier film may be additionally formed between resistance switching layer 140 and the first interlayer insulating layer 220 and the metal supply film 150. Then, in forming the second pillar structure 20 described above with reference to FIG. 10, the diffusion barrier film may be patterned to form a diffusion barrier layer. Thus, the second pillar structure 20 may further include the diffusion barrier layer such as diffusion barrier layer 255 described above with reference to FIG. 3. Thereafter, the cross-point array device 3 described above with reference to FIG. 3 may be manufactured by proceeding the subsequent processes described above with reference to FIGS. 10 and 11. The diffusion barrier film may be formed using, for example, a chemical vapor deposition method, an atomic layer deposition method and the like.

As described above, according to an embodiment of the present disclosure, the first pillar structure 10 including the threshold switching layer 135 belonging to a selection element, and the second pillar structure 20 including the resistance change memory layer 175 belonging to a resistive memory element, can be separated from each other with the resistance switching layer 140 interposed therebetween.

The resistance switching layer 140 may serve to prevent the threshold switching layer 135 from being damaged during the formation process of the second pillar structure 20. In the absence of the resistance switching layer 140, for example, when a deposition process and an etching process using plasma are carried out on the threshold switching layer 135, the threshold switching layer 135 may be damaged physically and chemically by the plasma. Accordingly, the operational reliability of the selection element including the threshold switching layer 135 may be degraded.

The resistance switching layer 140 may include conductive filaments 145 connecting the first pillar structure 10 to the second pillar structure 20. The conductive filaments 145 can reduce the cross-sectional area of a conductive path within the resistance switching layer 140 where electrical charges are conducted between the first and second pillar structures 10 and 20, so that the operating current of the cross-point array device along the conduction path can be effectively reduced.

On the other hand, immediately after performing the processes described above with reference to operations S110 to S150 in FIG. 4 and FIGS. 5 to 11, the resistance switching layer 140 may not include the conductive filaments 145 shown in FIGS. 2 and 3. The conductive filaments may be formed through a forming process described below with reference to FIG. 12.

Figure 12:
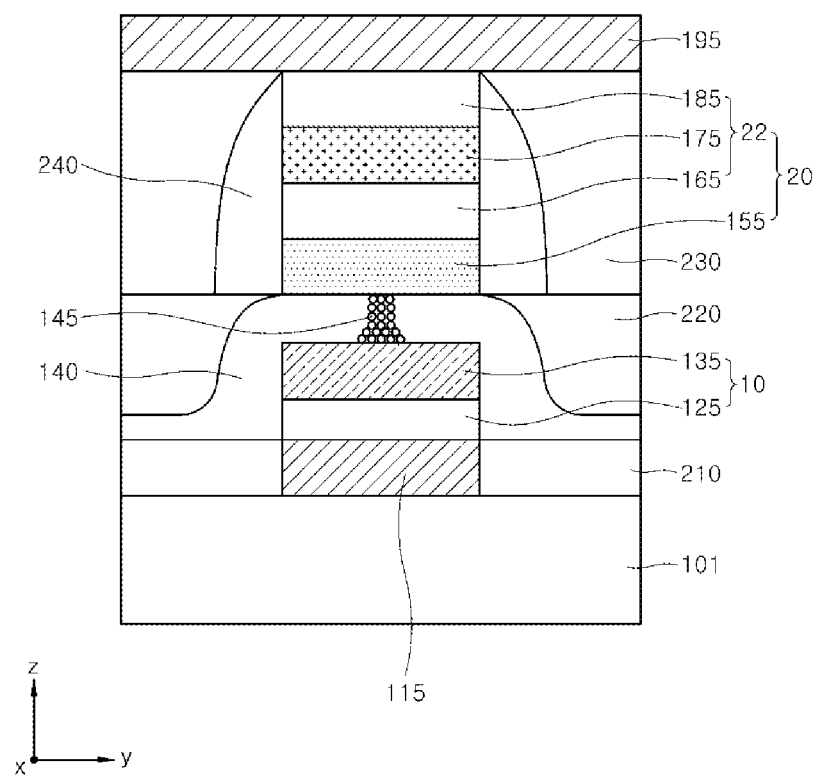
FIG. 12 is a view schematically illustrating a method of forming conductive filaments according to an embodiment of the present disclosure.

FIG. 12 is a view schematically illustrating a method of operating a cross-point array device to form conductive filaments according to an embodiment of the present disclosure. The method of operating the cross-point array device to form the conductive filaments may be used in conjunction with the cross-point array device manufactured by the manufacturing method described above and with reference to the flow chart in FIG. 4 and the cross-sectional views in FIGS. 5 to 11. Thus, the method of operating a cross-point array device to manufacture the conductive filaments can be used to form conductive filaments in the resistance switching layer 140 of the cross-point array devices 2 and 3 described above and with reference to FIG. 2 or FIG. 3. Consequently, the method of operating a cross-point array device to form conductive filaments, and the method of manufacturing a cross-point array device as described above and with reference to FIGS. 4 through 11, together may comprise a method of manufacturing or forming a cross-point array device with conductive filaments in a resistance switching layer.

Referring to FIG. 12, the cross-point array device manufactured by the manufacturing method described above with reference to FIGS. 4, and 5 to 11 may be prepared. The resistance switching layer 140 may include, for example, metal oxide and may have electrical insulation.

Next, a forming voltage may be applied between the first conductive line 115 and the second conductive line 195. As an example, a bias having a positive polarity may be applied to the second conductive line 195. The first conductive line 115 may be grounded or a bias having a predetermined potential may be applied to the first conductive line 115.

Metal ions in the metal supply layer 155 can migrate into the resistance switching layer 140 in response to the applied forming voltage. The metal ions migrated into the resistance switching layer 140 may be reduced by electrons transferred from the first conductive line 115 through the threshold switching layer 135. The reduced metal may form the conductive filaments 145 connecting the threshold switching layer 135 to the metal supply layer 155, so that the resistance switching layer 140 can have improved electrical conductivity. At this time, since the conductive filaments 145 are formed only in some regions of the resistance switching layer 140, the remaining regions where the conductive filaments 145 are not formed remain in an electrically high resistance state. The charge conduction between the threshold switching layer 135 and the metal supply layer 155 occurs only or primarily through the conductive filaments 145.

The conductive filaments 145 can be stably maintained in the resistance switching layer 140 during operation of the cross-point array device. When an operating voltage such as set voltage, reset voltage and read voltage is applied between the first conductive line 115 and the second conductive line 195, the resistance states of the threshold switching layer 135 and the resistance change memory layer 175 may be switched or varied. The operating voltage may be lower than a breakdown voltage of the conductive filaments 145 in the resistance switching layer 140. Therefore, the resistance switching layer 140 can continue to exhibit electrical conductivity by the conductive filaments 145 during the operation of the cross-point array device.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A cross-point array device comprising:
   a substrate;
   a first pillar structure, including a threshold switching layer, disposed on the substrate;
   a resistance switching layer surrounding an upper surface and a sidewall surface of the first pillar structure; and
   a second pillar structure, including a resistance change memory layer, disposed on the resistance switching layer,
   wherein the resistance switching layer has a conductive filament electrically connecting the first pillar structure to the second pillar structure.

2. The cross-point array device of claim 1, further comprising:
   a first conductive line disposed between the substrate and the first pillar structure and extending in a first direction; and
   a second conductive line disposed on the second pillar structure and extending in a second direction that is not parallel to the first direction.

3. The cross-point array device of claim 2, wherein the first pillar structure further comprises a lower electrode layer disposed between the first conductive line and the threshold switching layer.

4. The cross-point array device of claim 2, wherein the second pillar structure further comprises:
   a metal supply layer and an intermediate electrode layer sequentially disposed between the resistance switching layer and the resistance change memory layer; and
   an upper electrode layer disposed between the resistance change memory layer and the second conductive line.

5. The cross-point array device of claim 4, wherein the conductive filament comprises metal reduced from a metal ion supplied from the metal supply layer.

6. The cross-point array device of claim 4, wherein the metal supply layer comprises copper (Cu) or silver (Ag).

7. The cross-point array device of claim 4, further comprising a diffusion barrier layer disposed between the resistance switching layer and the metal supply layer.

8. The cross-point array device of claim 7, wherein the diffusion barrier layer comprises at least one of tantalum (Ta), titanium (Ti), tantalum nitride, titanium nitride, silicon carbide, and titanium tungsten.

9. The cross-point array device of claim 1, wherein the threshold switching layer comprises one of metal oxide, metal nitride, and a chalcogenide-based material.

10. The cross-point array device of claim 1, wherein the resistance switching layer comprises at least one of silicon oxide, aluminum oxide, tantalum oxide, titanium oxide, and hafnium oxide.

11. The cross-point array device of claim 1, wherein the resistance change memory layer comprises at least one of a chalcogenide-based material, metal oxide, a perovskite-based material, metal sulfides, and carbon.

12. A method of manufacturing a cross-point array device, the method comprising:
    providing a substrate;
    forming a first pillar structure having a threshold switching layer on the substrate;
    forming a resistance switching layer surrounding an upper surface and a side surface of the first pillar structure over the substrate;
    forming a second pillar structure having a resistance change memory layer on the resistance switching layer; and
    forming a conductive filament in the resistance switching layer, the conductive filament electrically connecting the first pillar structure to the second pillar structure.

13. The method of claim 12, further comprising:
    forming a first conductive line extending in a first direction between the substrate and the first pillar structure; and
    forming a second conductive line extending in a second direction that is not parallel to the first direction on the second pillar structure.

14. The method of claim 13, wherein forming the first pillar structure comprises:
    sequentially forming a lower electrode film and a variable resistance film on the substrate on which the first conductive line is formed; and
    patterning the variable resistance film and the lower electrode film,
    wherein the patterned lower electrode film and the first conductive line are electrically connected to each other.

15. The method of claim 12, wherein the threshold switching layer comprises one of metal oxide, metal nitride, and a chalcogenide-based material.

16. The method of claim 12, wherein forming the resistance switching layer comprises forming a metal oxide film using an atomic layer deposition method.

17. The method of claim 16, wherein the metal oxide film comprises at least one of silicon oxide, aluminum oxide, tantalum oxide, titanium oxide, and hafnium oxide.

18. The method of claim 12, wherein forming the second pillar structure comprises:

sequentially forming a metal supply film, an intermediate electrode film, a resistance change memory film and an upper electrode film on the resistance switching layer; and patterning the upper electrode film, the resistance change memory film, the intermediate electrode film, and the metal supply film using the resistance switching layer as an etch stop layer.

19. The method of claim 18, wherein the metal supply film comprises copper (Cu) or silver (Ag).

20. The method of claim 18, wherein forming the second pillar structure further comprises forming a diffusion barrier layer between the resistance switching layer and the metal supply layer.

* * * * *